United States Patent
McNeely

(10) Patent No.: US 6,408,322 B1
(45) Date of Patent: Jun. 18, 2002

(54) APPARATUS AND METHOD FOR ANCHORING PREDETERMINED POINTS OF THE IMPULSE FREQUENCY RESPONSE OF A PHYSICALLY-REALIZED FILTER

(75) Inventor: David Lowell McNeely, Indianapolis, IN (US)

(73) Assignee: Thomson Licensing S.A., Boulogne, Cedex (FR)

( * ) Notice: Subject to any disclaimer, the term of this patent is extended or adjusted under 35 U.S.C. 154(b) by 0 days.

(21) Appl. No.: 09/251,670

(22) Filed: Feb. 17, 1999

(51) Int. Cl.[7] ............................. G06G 7/02; G06F 17/10
(52) U.S. Cl. ..................... 708/819; 708/319; 708/320; 708/306
(58) Field of Search ..................... 708/819, 312–313, 708/319–320, 306

(56) References Cited

U.S. PATENT DOCUMENTS

| | | | |
|---|---|---|---|
| 4,760,542 A | 7/1988 | Mehrgardt et al. ............ 364/724 |
| 4,791,597 A | 12/1988 | Miron et al. ............ 364/724.03 |
| 4,852,034 A | 7/1989 | Takayama ............... 364/724.01 |
| 5,170,369 A | 12/1992 | Rossum ................... 364/724.17 |
| 5,195,140 A | * 3/1993 | Kudo et al. .................. 708/306 |
| 5,274,579 A | * 12/1993 | Nelson et al. ............... 708/312 |
| 5,319,585 A | 6/1994 | Amrany ................... 364/724.19 |
| 5,389,923 A | 2/1995 | Iwata et al. ..................... 341/61 |
| 5,412,638 A | 5/1995 | Koulopoulos et al. ......... 369/59 |
| 5,420,891 A | * 5/1995 | Akansu ........................ 708/313 |
| 5,489,879 A | 2/1996 | English ......................... 332/103 |
| 5,553,014 A | 9/1996 | DeLeón, II et al. ..... 364/724.19 |
| 5,610,942 A | 3/1997 | Chen ............................ 375/242 |
| 5,621,404 A | 4/1997 | Heiss et al. ..................... 341/61 |
| 5,838,600 A | 11/1998 | McNeely et al. ...... 364/724.012 |

OTHER PUBLICATIONS

J. Baldwin, "Digital Standards Conversion", Digital Video/SMPTE, 1977, vol. 1, pp. 84–93.
Knutson, et al., "An Optimal Approach to Digital Raster Mapper Design", IEEE, May 1991, pp. 72–73.

* cited by examiner

Primary Examiner—Tan V. Mai
(74) Attorney, Agent, or Firm—Joseph S. Tripoli; Joseph J. Laks; Ronald H. Kurdyla

(57) ABSTRACT

The disclosed filter structure employs parallel first and second input signal data paths. The first data path includes a digital Finite Impulse Response (FIR) filter having a small number of non-zero multiplier coefficients to define its theoretical impulse frequency response. The second data path includes plural series filters including (1) a digital FIR or Infinite Impulse Response (IIR) filter including a reduced-number of designer-chosen non-zero multiplier coefficients that tend to introduce error sources in the physical-realized filter structure's impulse frequency response and (2) a set of one or more frequency stop filters, each of which permits zero signal transmission therethrough at a different selected frequency. This arrangement anchors the frequency response value of the filter structure near each of the different selected frequencies of the set substantially at the corresponding theoretical impulse frequency response value of the digital FIR filter of the first data path near that one of the plurality of different selected frequencies of the set. The summed outputs of the first and second data paths is the filter output.

16 Claims, 8 Drawing Sheets

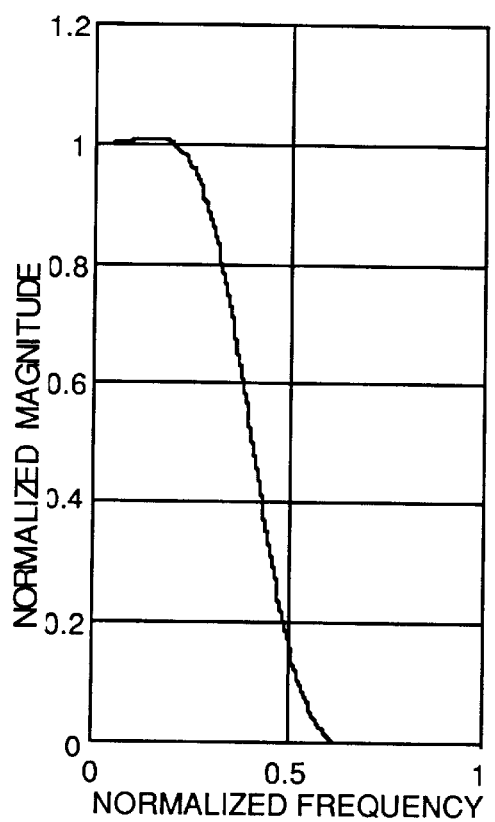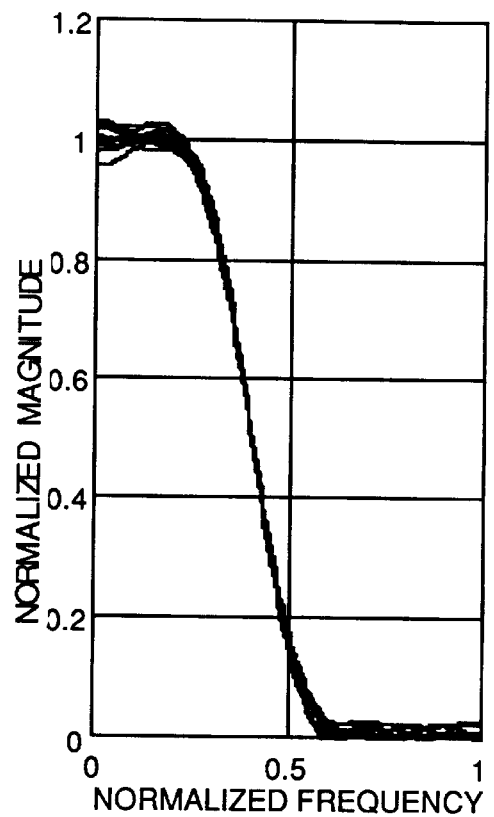
FIGURE 1-1a  FIGURE 1-1b

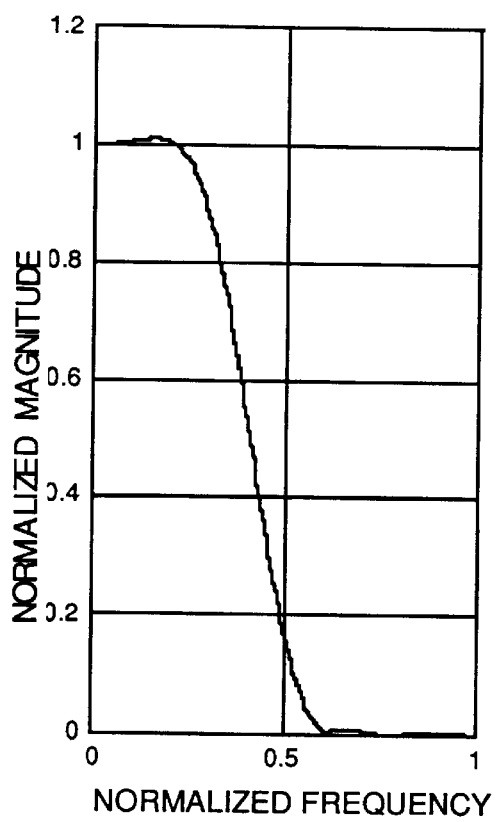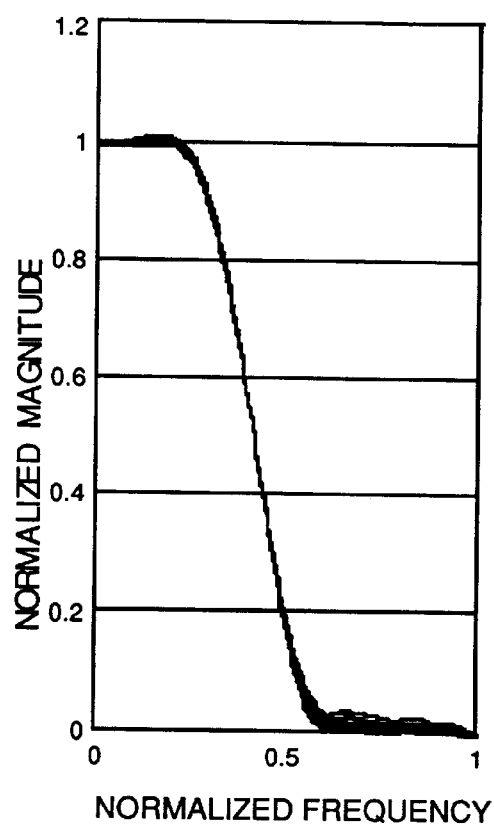
FIGURE 2-1a  FIGURE 2-1b

APPARATUS AND METHOD FOR ANCHORING PREDETERMINED POINTS OF THE IMPULSE FREQUENCY RESPONSE OF A PHYSICALLY-REALIZED FILTER

FIELD OF THE INVENTION

The present invention generally relates to filter design and, more particularly, to a filter design employing minimal hardware that is capable of providing robust physical filter realizations.

DESCRIPTION OF THE PRIOR ART

It is known that digitally sampling a frequency component equal to one-half the sampling frequency (referred hereinafter as the Nyquist folding frequency) results in successive sample values thereof being of the same magnitude and opposite polarity. Therefore, the algebraic sum of successive sample values of the Nyquist folding frequency is zero.

It is also known that when an ongoing time-varying input signal is first delayed for a given interval and then the delayed value thereof is subtracted from the current value thereof over this interval, the direct-current (DC) component (i.e., the zero frequency component) of the input signal will be eliminated from the resulting alternating current (AC) difference signal (i.e., all the frequency components of the difference signal are higher in frequency than zero). Further, in the case of an input signal comprising an ongoing data stream of periodically-occurring digital sample values, it is known that each sample value may be delayed for one period and then subtracted from the current sample value to thereby provide a data stream of difference values from which the zero frequency (DC) component has been eliminated. In this regard, the disclosure of U.S. Pat. No. 5,838,600, entitled "DC Gain Invariant Filter Implementation", filed by David L. McNeely et al., and assigned to the same assignee as the present application, is incorporated by reference herein. In particular, U.S. Pat. No. 5,838,600 is directed to a filter design that is capable of ensuring a constant DC gain independent of physical filter realization errors under all input conditions with a minimal amount of hardware.

However, there are other problems which arise in the design of practical physically-realizable digital filters required for various system purposes. In particular, there are distinctions to be made between the mathematical statement of the digital filter's theoretical impulse frequency response and a physical realization of the desired filter's impulse frequency response. Engineering tradeoffs are made to reduce size, cost, and complexity of the filter in the desired application. For example, the following tradeoffs are common:

1. Multiplier coefficient values are modified to ease realization.
2. Data path numerical precision less than the full precision needed for mathematical correctness is often employed.
3. Different precisions are used in different parts of the realization as not all paths equally impact function.
4. Mixtures of truncation and rounding processes are used.
5. Simplified non-exact multiplier structures are sometimes used.

These error sources change the frequency and time response of the filter. Some changes in this response are unimportant to system function, while other changes may significantly degrade the system function under some combination of input conditions and filter state (if time varying). Therefore, there is a need for a filter design approach which mitigates degrading effects on system function caused by these error sources.

SUMMARY OF THE INVENTION

The present invention is directed to a filter design approach which mitigates problems caused by the aforesaid error sources by providing a practical physically-realizable filter structure that stabilizes the filter response at a set of one or more anchor frequencies so that the frequency response at these anchor frequencies is unaffected by these error sources. In addition, this filter structure adds degrees freedom to the design of any desired filter impulse response, which aid in the discovery of efficient physical realizations of a designed filter.

More specifically, the present invention is directed a physically-realized filter structure designed to have an impulse frequency response to an ongoing input signal having a given frequency bandwidth applied thereto that is substantially equivalent to a certain theoretical impulse frequency response, wherein the filter structure comprises a given filter that introduces realization errors into its frequency response. The deleterious effects of these realization errors is reduced by incorporating additional filters in the physically-realized filter structure, which additional filters (1) render the given filter inoperative at a set comprising at least one selected frequency within the given frequency bandwidth and (2) anchor the frequency response value of the filter structure in the neighborhood of the one selected frequency of the set substantially at the corresponding theoretical impulse frequency response value in the neighborhood of the one selected frequency of the set.

BRIEF DESCRIPTION OF THE DRAWING

FIGS. 1-1$a$, 1-1$b$, 1-2$a$, 1-2$b$ and 1-3$b$ are graphs of impulse-frequency-response normalized magnitudes as a function of normalized frequency that relate to first, second and third examples of different theoretical impulse frequency responses of the conventional digital filter of FIG. 1;

FIGS. 2-1$a$, 2-1$b$, 2-2$b$ and 2-3$b$ are graphs of impulse-frequency-response normalized magnitudes as a function of normalized frequency that relate to first, second and third examples of different frequency-stabilized impulse frequency responses of the physically-realizable digital filter structure of FIG. 2 which may be substituted for the corresponding theoretical impulse frequency response of the aforesaid first, second and third examples of the conventional digital filter of FIG. 1;

DESCRIPTION OF THE PREFERRED EMBODIMENTS

Figure 1:
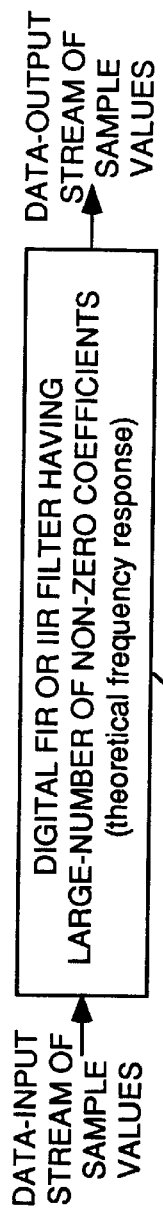
FIG. 1 diagrammatically illustrates a conventional digital FIR or IIR filter having a relatively large number of non-zero multiplier coefficients that precisely define a certain theoretical impulse frequency response, which filter operates on the successive sample values of an ongoing input data stream applied thereto to derive therefrom the successive sample values of an ongoing output data stream.

Referring to FIG. 1, there is diagrammatically shown digital finite-impulse response (FIR) or infinite-impulse response (IIR) filter 100 having a large number of non-zero multiplier coefficients which derives a data-output stream of successive sample values in response to a data-input stream of successive sample values (which, by way of example, may define a digital video signal) applied as an input thereto. As indicated in FIG. 1, filter 100 has a precise theoretical impulse frequency response which is defined by the respective values of its large number of non-zero multiplier coefficients.

Assuming first that filter 100 is an n-tap FIR filter, its theoretical impulse frequency response H(z) is:

$$H(z) = \sum_{i=o}^{n-1} a_{[i]} z^{(-i)},$$

where the symbol a[i] represents the value of the ith multiplier coefficient and the symbol $z^{(-i)}$ represents a delay of i sample periods of the data-input stream of successive sample values.

Each of these multiplier coefficients, in binary-bit form, is used to multiply each successive sample value, in binary-bit form, of the data-input stream applied to n-tap filter 100. One known way to physically realize each of these coefficient multiplications is to provide hardware to first shift the bits of a sample value in accordance with the place value of each significant bit of that coefficient and then add together, in binary-bit form, the resulting shifted sample values. It is apparent that the total number of required physically-realized binary-bit adders used for this purpose depends on (1) the number of significant bits in each multiplier coefficient and (2) the number of non-zero valued multiplier coefficients required by the theoretical impulse frequency response n-tap filter 100.

By way of a first example, assume filter 100 to be a 14-tap linear-phase FIR filter for precisely implementing a theoretical impulse frequency response H(z) in accordance with the following integer multiplier coefficients designed by the Kaiser window method:

$$H(z) = \frac{1 + 2z^{-1} - 4z^{-2} - 13z^{-3} - z^{-4} + 47z^{-5} + 96z^{-6} + 96z^{-7} + 47z^{-8} - z^{-9} - 13z^{-10} - 4z^{-11} + 2z^{-12} + z^{-13}}{256}.$$

FIG. 1-1a is a graph of the normalized magnitude as a function of the normalized frequency (wherein the normalized frequency of 1 corresponds to the Nyquist folding frequency, which is defined as being equal to one-half the sampling frequency) of this theoretical impulse frequency response H(z) of the aforesaid first-example 14-tap linear-phase FIR filter. Then, in order to test the frequency stability of this theoretical impulse frequency response H(z) to physical realization errors, each of the multiplier-coefficient values thereof had a randomly-chosen number smaller in magnitude than $\frac{1}{128}$ added thereto to thereby emulate a single perturbed impulse-frequency-response filter. Repeating this process many times resulted in an emulated ensemble of perturbed impulse-frequency-response filters. FIG. 1-1b is a graph of the normalized magnitude as a function of the normalized frequency of this emulated ensemble of perturbed impulse-frequency-response filters.

Physically realizing this conventional 14-tap linear-phase FIR filter requires a large amount of hardware, In particular, each of the four multiplier coefficients impulse frequency response H(z) of the aforesaid first-example having the value 1 can be represented by a single binary term so that a multiplication thereby does not require shifting. However, each of the two multiplier coefficients having the value 2 can be represented by two binary terms so that a multiplication thereby does require a single shifting, while each of the two multiplier coefficients having the value 4 can be represented by three binary terms so that a multiplication thereby does require two shiftings. Further, each of the two multiplier coefficients 96 can be represented by a multiplier coefficient having the value 32 (requiring 5 shiftings) added by a single adder to a multiplier coefficient having the value 64 (requiring 6 shiftings). Similarly, each of the two multiplier coefficients 13 can be represented by a multiplier coefficient having the value 1 (requiring no shifting) added by a first adder to a multiplier coefficient having the value 4 (requiring 2 shiftings) and then added by a second adder to a multiplier coefficient having the value 8 (requiring 3 shiftings), while each of the two multiplier coefficients 47 can be represented by a multiplier coefficient having the value 32 (requiring 5 shifting) added by a first adder to a multiplier coefficient having the value 16 (requiring 4 shiftings) and then subtracting a multiplier coefficient having the value 1 (requiring no shifting) therefrom by an algebraic second adder. Therefore, a physically realized multiplication means for this first example of an n-tap digital FIR filter 100 would require hardware comprising a total of 10 adders besides means to provide as many 6 shiftings. Such a physically realized multiplication means would usually be too complicated and costly to be practical for use in mass-produced commercial apparatus (e.g., a digital television receiver, for example). It is for this reason that the aforesaid engineering tradeoffs in the design of a practical physically-realized filter is made to reduce its size, cost, and complexity, despite the fact that these engineering tradeoffs may often introduce error sources that have the effect of degrading the frequency stability of the filter with respect to its desired theoretical impulse frequency response.

Figure 2:
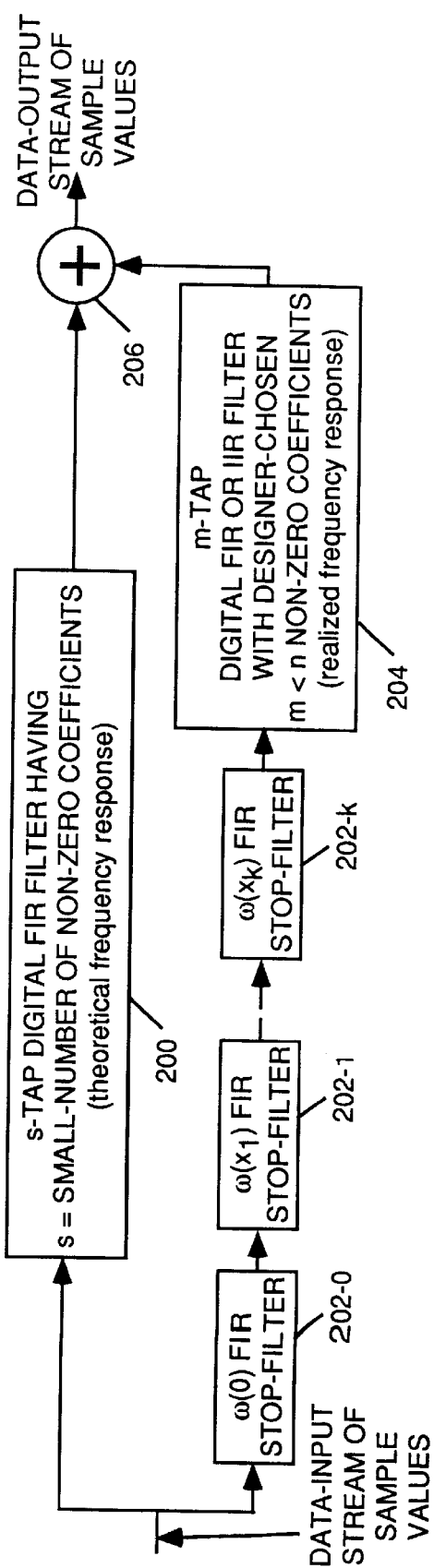
FIG. 2 diagrammatically illustrates an embodiment of a physically-realizable digital filter structure designed in accordance with the principles of the present invention, which physically-realizable digital filter structure may be substituted for the conventional digital FIR or IIR filter of FIG. 1 to provide a frequency-stabilized impulse frequency response that is substantially equivalent to the theoretical impulse frequency response of the conventional digital FIR or IIR filter of FIG. 1.

Reference is now made to FIG. 2, which shows the design of a reduced size, cost, and complexity physically-realized filter structure 201 to provide an impulse frequency response having increased frequency stability that is substantially equivalent to the theoretical impulse frequency response of digital FIR or IIR filter 100 of FIG. 1. More particularly, FIG. 2 shows a data-input stream of successive sample values that is applied (1) over a first of two parallel data paths as an input to s-tap FIR filter 200 having a small number of non-zero multiplier coefficients (compared to the large number of non-zero multiplier coefficients of filter 100 of FIG. 1) and (2) over a second of the two parallel data paths as an input to ω(0) FIR stop-filter 202-0. ω(0) FIR stop-filter 202-0 is the first of k+1 serially-connected, ordinally-arranged FIR stop-filters 202-0 to 202-k in the second data path. FIR stop-filter 202-0 provides substantially zero transmission therethrough to the 0-frequency (DC) component of the digital input signal applied thereto. Similarly, each one of the other FIR stop-filters 202-1 to 202-k 0 provides substantially zero transmission therethrough to a different preselected one of individual frequency components $\omega(X_1) \ldots (X_k)$ within the frequency bandwidth of the digitally-sampled input signal to that stop-filter. The second data path further comprises to m-tap digital FIR or IIR filter 204 with designer-chosen m<n non-zero multiplier coefficients, which is serially connected to stop-filter 202-k, Therefore, the digitally-sampled output signal from stop-filter 202-k is applied as an input to m-tap digital FIR or IIR filter 204. The first data path output, comprising the data-output stream of sample values from filter 200, is applied as a first input to summer 206 and the second data path output, comprising the data-output stream of sample values from filter 204, is applied as a second input to summer 206. The s non-zero coefficients of filter 200 and the m non-zero coefficients of filter 204 are chosen by the filter designer to provide the data-output stream of sample values from summer 206 (which constitutes the data-output stream of sample values from physically-realized filter structure 201) with an impulse frequency response that is substantially equivalent to the theoretical impulse frequency response of the conventional n-tap digital FIR filter of FIG. 1.

More particularly, as known, digitally filtering of a sampled-signal frequency having a value higher than one-half the sampling frequency results in aliasing. Therefore, the maximum frequency bandwidth of the signal defined by the data-input stream of sample values to digital filter structure 201 extends from a lower limit of zero frequency (DC) to an upper limit equal to one-half the sampling frequency (the Nyquist folding frequency). Normalizing the signal amplitude to a value of one and normalizing the Nyquist folding frequency to a value of $\cos(1\pi)$, any normalized component of the input signal within its frequency bandwidth is defined as $\omega(x)=\cos(x\pi)$, where $0<x<1$.

The second data path does not transmit therethrough any of the k+1 different individual preselected stop frequency components $\omega(0)$ and $\omega(x_1) \ldots (X_k)$ which are included within the frequency bandwidth of the applied digitally-sampled input signal. Therefore, in the neighborhood of each of these stop frequency components $\omega(0)$ and $\omega(x_1) \ldots (X_k)$, the impulse frequency response of filter structure 201, taken as a whole, is substantially determined solely by the impulse frequency response of filter 200. However, for all signal-bandwidth frequency components outside of these neighborhoods, the impulse frequency response of filter structure 201, taken as a whole, is determined by the impulse frequency response of filter 200 of the first data path in parallel with the resultant impulse frequency response of the serially-connected filters 200-0 ... 200-k and 204 of the second data path. The designer chooses the s multiplier-coefficient values of filter 200 so as to provide a response at the frequency of each of the stop frequency components which is substantially the same as that would be obtained from filter 100 at each frequency corresponding to that stop-frequency component and chooses the m multiplier-coefficient values of filter 204 so that the impulse frequency response of the filter structure 201, taken as a whole, is substantially equivalent to that of filter 100 for all signal-bandwidth frequency components outside of these neighborhoods.

The following impulse frequency response filter design criteria for FIR stop-filters are known:

stop DC frequency component $\omega(0)=(1-z^{-1})$;

stop frequency component $\omega(x_i)=(1-2\cos \omega(X_i)z^{-1}+z^{-2}$; and stop Nyquist folding frequency component $\omega(x=1)=(1+z^{-1})$.

Consider now the case of a first given design of the physically-realizable, simplified filter structure 201 of FIG. 2 that has an impulse frequency response substantially equivalent to that of the complex 14-tap linear phase FIR filter of the above-described first example of filter 100 of FIG. 1. In this first given design, three stop frequency components are chosen, which consist of the stop DC frequency component $\omega(0)$, the stop Nyquist folding frequency component $\omega(x=1)$ and the stop frequency component $\omega(x=0.4)$. Further, in this first given design, each of the s chosen multiplier-coefficient values of filter 200 and each of the m chosen multiplier-coefficient values of filter 204 permit multiplication to take place with no more than a single adder being required. While desirable from the point of view of maximizing the structural simplification of filter structure 201, this single-adder restriction is not essential to the basic benefits of the present invention. The impulse frequency response of this first giver design of filter structure 201 is:

$$H(z) = \frac{z^{-6} + 3z^{-7} + 3z^{-8} + z^{-9}}{8} \quad (1)$$

$$+ \left(\frac{1-z^{-2}}{2}\right) \cdot \left(\frac{1 - \frac{5}{8}z^{-1} + z^{-2}}{2}\right) \cdot \left(\frac{2 + 6z^{-1} - 4z^{-2} - 31z^{-3} - 24z^{-4} + 24z^{-5} + 31z^{-6} + 4z^{-7} - 6z^{-8} - 2z^{-9}}{128}\right) \quad (2)$$

Expression (1) defines the impulse frequency response of an s-tap FIR filter 200 of the first data path of the first given design of filter structure 201 of FIG. 2 having only 4 non-zero multiplier-coefficients (which corresponds to a 14-tap FIR filter in which the value of the multiplier-coefficient of each of taps 1 to 5 and 10 to 14 is zero and only the multiplier-coefficients of each of taps 6 to 9 has anon-zero value), while expression (2) defines the resultant impulse frequency response of all the serially-connected filters of the second data path of the first given design of filter structure 201 of FIG. 2. More specifically, the respective values of the multiplier coefficients of both expressions (1) and (2) have been reduced to their least common denominator. The first bracketed terms numerator $1-z^{-2}$ of expression 2 can be factored into $(1-z^{-1})(1+z^{-1})$, where $(1-z^{-1})$ represents the impulse frequency response of the stop DC frequency component $\omega(0)$ and $(1+z^{-1})$ represents the impulse frequency response of the stop Nyquist folding frequency component $\omega(x=1)$. The numerator $1-\tfrac{5}{8} z^{1}+z^{-2}$ of the second bracketed terms of expression 2 represents the impulse frequency response stop frequency component $\omega(x=0.4)$. The third bracketed terms of expression 2 represent the impulse frequency response of m-tap filter 204 of the first given design of filter structure 201, which in this first given design is an FIR filter in which m is equal to 10.

In the above first given design of the physically-realizable, simplified filter structure 201 of FIG. 2 that has an impulse frequency response substantially equivalent to that of the complex 14-tap linear phase FIR filter of the above-described first example of filter 100 of FIG. 1, the precisely computed value for the 0.4 stop frequency component, which is equal to $\cos(0.4\pi)$ is 0.309. Therefore, the value of $2\cos \omega(0.4)$ in the expression $(1-2\cos \omega(0.4)$ $z^{-1}+z^{-2}$) is 0.618. Thus, the value ⅝ (which is equal to 0.625) in the numerator of the second bracketed terms of expression 2 is in error with respect to the precisely computed value of 0.618 by only the very small amount of 0.007 (i.e., 1.13%). However, in a physically-realized filter, it is much simpler to express the value 0.625 in binary form than it would be to express the value 0.618 in binary form. Further, the relatively simple impulse frequency response of 4-tap FIR filter 200 of the first data path of the first given design of filter structure 201 of FIG. 2 provides a normalized output amplitude of −0.5295 for an input-signal frequency component of cos (0.4π), while the much more complex 14-tap FIR filter of the above-described first example of filter 100 of FIG. 1 provides a normalized output amplitude of −0.5174 for an input-signal frequency component of cos (0.4π). Thus, the substitution of a simple 4-tap FIR filter 200 for a complex 14-tap FIR filter 100 results in only a very small error of only 2.33%. Therefore, the impulse frequency response of the first given physically-realizable design of filter structure 201 of FIG. 2 is anchored in the neighborhood of the stop frequency component ω(x=0.4), despite realization errors present in 10-tap filter 204 of the first given design. Similarly, the impulse frequency response of the first given design of filter structure 201 of FIG. 2 is also anchored in the neighborhood of the stop DC frequency component ω(0) and in the neighborhood of the stop Nyquist folding frequency component ω(x=1). These three anchors stabilize the first given-design impulse frequency response of a physically-realized filter structure 201 of FIG. 2 to maintain it substantially equivalent to the theoretical impulse frequency response of the above-defined first example of a 14-tap FIR filter 100 of FIG. 1, but with the first given design of filter structure 201 still providing a large saving in physical-realization hardware compared to the physical-realization hardware that would be required to implement such a 14-tap FIR filter.

FIG. 2-1a is a graph of the normalized magnitude as a function of the normalized frequency of the impulse frequency response H(z) of the aforesaid first given design of filter structure 201, which makes apparent that it is substantially equivalent to the theoretical impulse frequency response H(z) of the first-example 14-tap linear-phase FIR filter shown in FIG. 1-1a.

FIG. 2-1b is a graph of the normalized magnitude as a function of the normalized frequency of an emulated ensemble of impulse-frequency-response filters which result when the values of the designer-chosen multiplier coefficients of filter 204 of filter structure 201 are perturbed with respect to the unperturbed values thereof that contribute to the impulse frequency response H(z) shown in the FIG. 2-1a graph. By comparing the FIG. 2-1b graph with the FIG. 1-1b graph, it is apparent that the first given design of filter structure 201 achieves a higher frequency stability than does the aforesaid first-example 14-tap linear-phase FIR filter at most signal-bandwidth frequencies. This is due to the anchoring in the neighborhood of each of the three stop frequencies provided by this first given design of filter structure 201.

By way of a second example, assume filter 100 to be a 9-tap non-linear phase FIR filter for precisely implementing a theoretical impulse frequency response H(z) in accordance with the values of the following integer multiplier coefficients:

$$H(z) = \frac{32 + 89z^{-1} + 98z^{-2} + 43z^{-3} + z^{-4} - 7z^{-5} - 2z^{-6} + 0z^{-7} + z^{-8}}{256}.$$

In the case of a second given design of the physically-realizable, simplified filter structure 201 of FIG. 2 that has an impulse frequency response substantially equivalent to that of the complex 9-tap non-linear phase FIR filter of the above-described second example of filter 100 of FIG. 1, two stop frequency components are chosen which consist of the stop DC frequency component ω(0) and the stop frequency component ω(x=0.409). The impulse frequency response of this second given design of filter structure 201 is:

$$H(z) = \frac{2z^{-2} - z^{-3} + z^{-4}}{2} \quad (1)$$

$$+$$

$$(1-z^{-1}) \cdot \left( \frac{16 - 9z^{-1} + 16z^{-2}}{16} \right) \cdot \quad (2)$$

$$\left( \frac{32 + 139z^{-1} + 9z^{-2} + 0z^{-3} - 2z^{-4} - z^{-5}}{256} \right)$$

Expression (1) defines the impulse frequency response of s-tap FIR filter 200 of the first data path of the second given design of filter structure 201 of FIG. 2, while expression (2) defines the resultant impulse frequency response of all the serially-connected filters of the second data path of the second given design of filter structure 201 of FIG. 2. The first bracketed terms $1-z^{-2}$ of expression 2 represents the impulse frequency response of the stop DC frequency component ω(0). The second bracketed terms $(16-9z^{-1}+16z^{-2})/16$ of expression 2 represents the impulse frequency response of stop frequency component ω(x=0.409), where $(16-9z^{-1}+16z^{-2})$ in integer multiplier coefficients is substantially equal to $(1-2\cos(0.409\pi)z^{-1}+z^{-2})$. The third bracketed terms of expression 2 represent the impulse frequency response of m-tap filter 204 of the second given design of filter structure 201, which in this second given design is an FIR filter in which m is equal to 6.

Figures 1, 2, 2A:
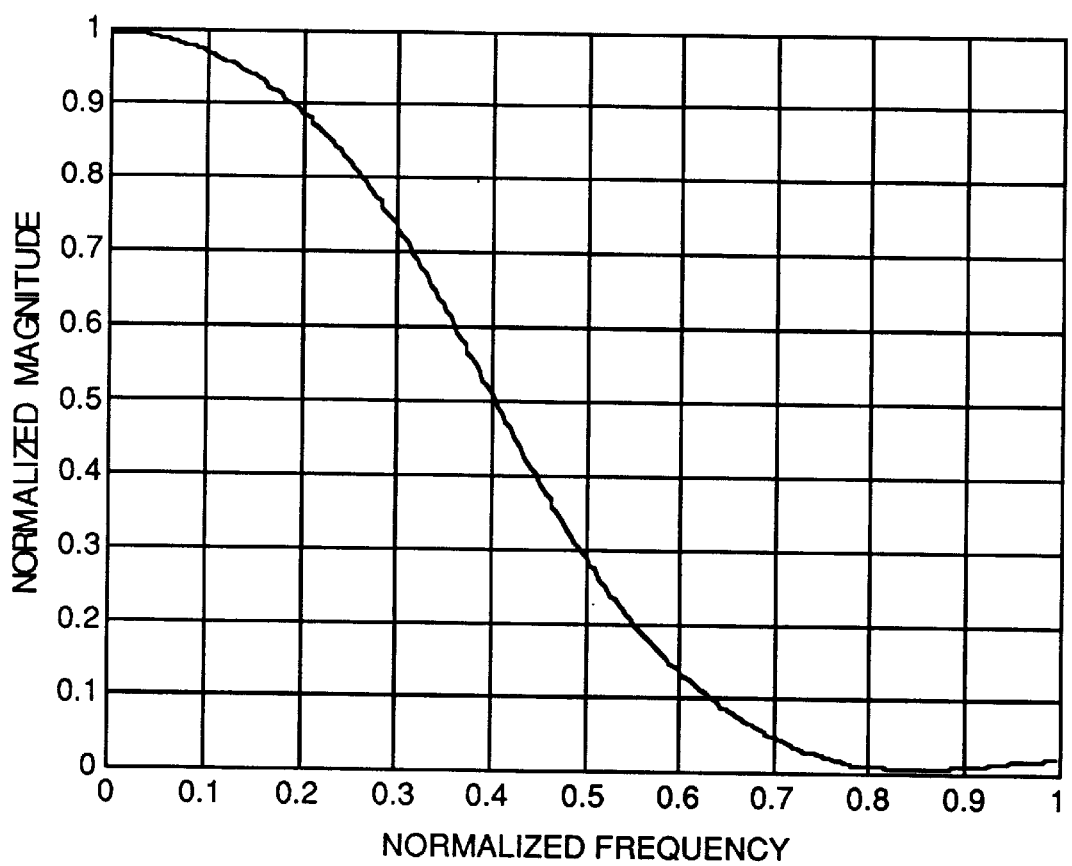
Figures 1, 2, 2B:
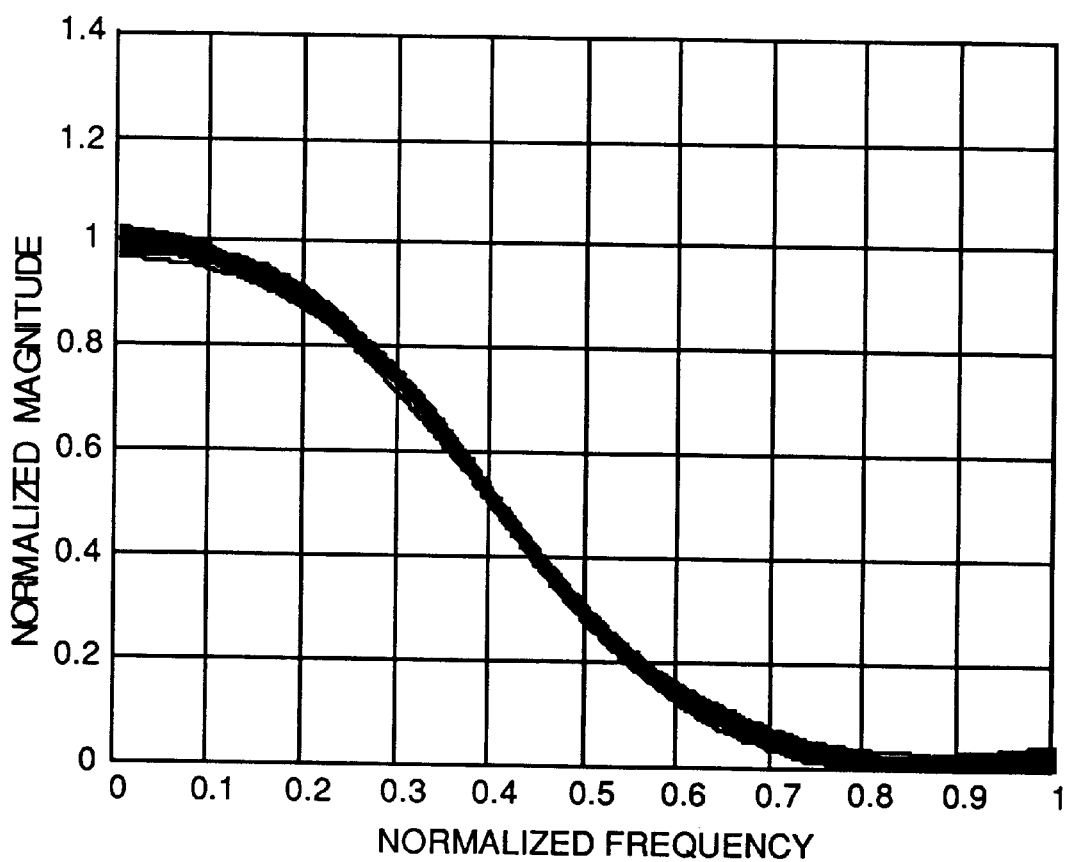

FIG. 1-2a is a graph of the normalized magnitude as a function of the normalized frequency of the theoretical impulse frequency response H(z) of the aforesaid 9-tap non-linear phase FIR filter; FIG. 1-2b is a graph of the normalized magnitude as a function of the normalized frequency of an emulated ensemble of perturbed impulse-frequency-response filters that result from perturbing the values of the multiplier coefficients of the theoretical impulse frequency response H(z) shown in the FIG. 1-2a graph, and FIG. 2-2b is a graph of the normalized magnitude as a function of the normalized frequency which result when the values of the designer-chosen multiplier coefficients of filter 204 of filter structure 201 are perturbed with respect to the unperturbed values thereof that contribute to the impulse frequency response H(z) of the aforesaid second given design of filter structure 201 of FIG. 2 that has an impulse frequency response substantially equivalent to that of the 9-tap non-linear phase FIR filter of the above-described second example of filter 100 of FIG. 1. By comparing the FIG. 2-2b graph with the FIG. 1-2b graph, it is apparent that the second given design of filter structure 201 achieves a higher frequency stability than does the aforesaid conventional 9-tap non-linear phase FIR filter at all signal-bandwidth frequencies except those in the neighborhood of the Nyquist folding frequency (which is positioned relatively far from the stop frequency ω(x=0.409)). However, the frequency stability in the neighborhood of the Nyquist folding frequency could be improved by employing one or more additional stop-frequency filters at or near the Nyquist folding frequency in this second design for anchoring the impulse frequency response of the second design of filter structure 201 in the neighborhood of the Nyquist folding frequency.

By way of a third example, assume filter 100 to be a conventional 3rd order Butterworth design IIR filter defined by a 4-tap numerator and a 4-tap denominator for precisely implementing a theoretical impulse frequency response H(z) in accordance with the following integer multiplier coefficients:

$$H(z) = \frac{6 + 19z^{-1} + 19z^{-2} + 6z^{-3}}{64 + 37z^{-1} + 27z^{-2} - 4z^{-3}}.$$

In the case of a third given design of the physically-realizable, simplified filter structure 201 of FIG. 2 that has an impulse frequency response substantially equivalent to that of the complex IIR filter of the above-described third example of filter 100 of FIG. 1, two stop frequency components are chosen which consist of the stop DC frequency component ω(0) and the stop Nyquist folding frequency component ω(x=1). The impulse frequency response of this third given design of filter structure 201 is:

$$H(z) = \frac{z^{-1} + z^{-2}}{2} \quad (1)$$

$$+$$

$$(1 - z^{-2}) \cdot \left( \frac{6 - 12z^{-1} + 9z^{-2}}{64 - 25z^{-1} + 22z^{-2}} \right) \quad (2)$$

Expression (1) defines the impulse frequency response of s-tap FIR filter 200 of the first data path of the third given design of filter structure 201 of FIG. 2, while expression (2) defines the resultant impulse frequency response of all the serially-connected filters of the second data path of the third given design of filter structure 201 of FIG. 2. The first bracketed terms numerator $1-z^{-2}$ of expression 2 can be factored into $(1-z^{-1})(1+z^{-1})$, where $(1-z^{-1})$ represents the impulse frequency response of the stop DC frequency component ω(0) and $(1+z^{-1})$ represents the impulse frequency response of the stop Nyquist folding frequency component ω(x=1). The second bracketed terms of expression 2 represent the impulse frequency response of m-tap filter 204 of the second given design of filter structure 201, which in this second given design is an IIR filter in which m of each of the numerator and denominator is equal to 6.

Figures 1, 2, 3, 3B:
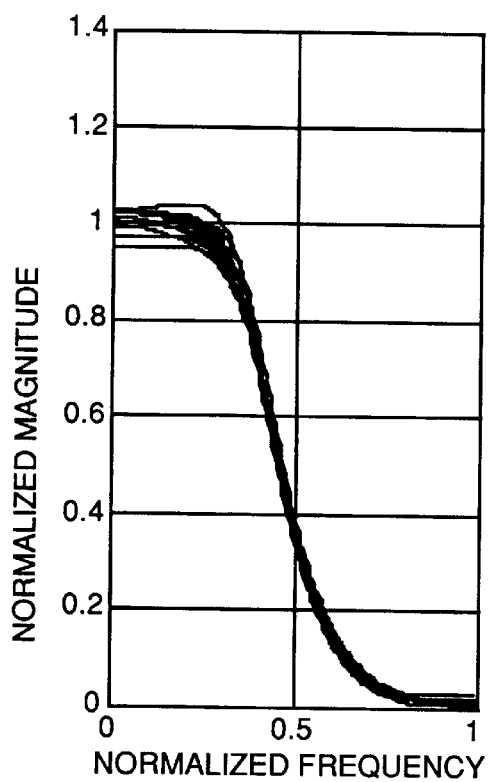
FIG. 3$a$ diagrammatically illustrates a first modification of the physically-realizable digital filter structure shown in FIG. 2 to achieve a digital-in/analog-out hybrid filter structure designed in accordance with the principles of the present invention that provides a certain frequency-stabilized impulse frequency response.
FIG. 3b diagrammatically illustrates a second modification of the physically-realizable digital filter structure shown in FIG. 2 to achieve an analog-in/digital-out hybrid filter structure designed in accordance with the principles of the present invention to provide a certain frequency-stabilized impulse frequency response.
Figures 2, 3, 3B:
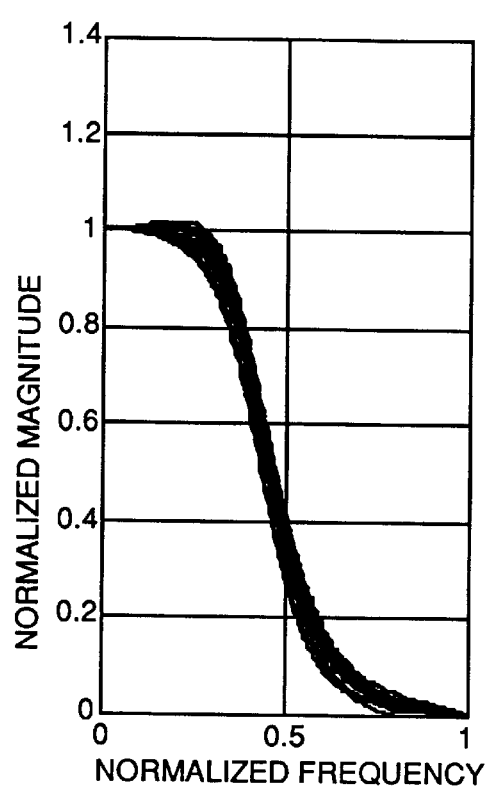
Figures 2, 2B:
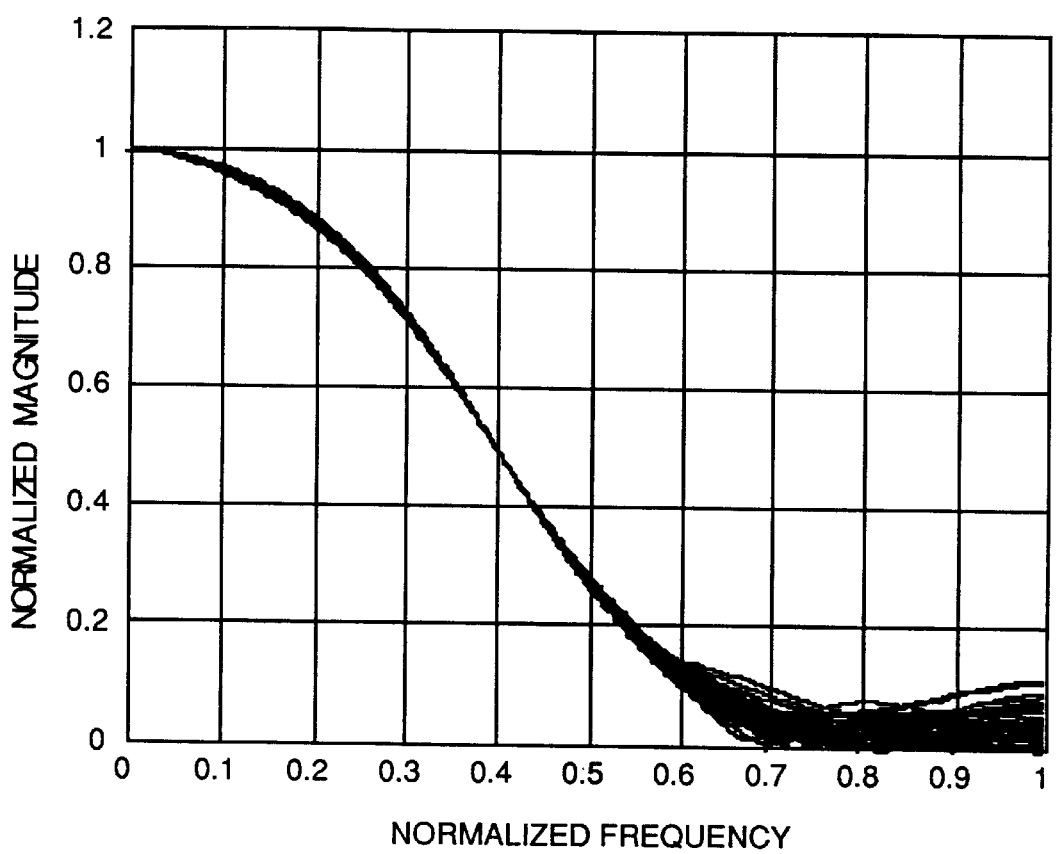

FIG. 1-3b is a graph of the normalized magnitude as a function of the normalized frequency of an emulated ensemble of perturbed impulse-frequency-response filters that result from perturbing the values of the multiplier coefficients of the theoretical impulse frequency response H(z) of the conventional 3rd order Butterworth design IIR filter of the third example, and FIG. 2-3b is a graph of the normalized magnitude as a function of the normalized frequency of the impulse frequency response H(z) of an emulated ensemble of perturbed impulse-frequency-response filters which result when the values of the designer-chosen multiplier coefficients of filter 204 of filter structure 201 are perturbed with respect to the unperturbed values thereof that contribute to the impulse frequency response H(z) of the aforesaid third given design of filter structure 201 of FIG. 2 that has an impulse frequency response substantially equivalent to that of the 3rd order Butterworth design IIR filter of the above-described third example of filter 100 of FIG. 1. By comparing the FIG. 2-3b graph with the FIG. 1-3b graph, it is apparent that the third given design of filter structure 201 achieves a higher frequency stability than does the aforesaid conventional 3rd order Butterworth design IIR filter at most signal-bandwidth frequencies.

One benefit of the present invention is that a filter structure conforming to that of filter structure 201 shown in FIG. 2 adds degrees of freedom to the design of any desired filter impulse frequency response, which aid in the discovery of efficient physical realizations of filter structure 201. In this regard, for any case in which the total number s of non-zero multiplier coefficients of filter 200 is equal or greater than the sum of the orders of the k+1 stop-filters 200-0 to 200-k, the present invention can be used to implement the design of any desired filter impulse frequency response. However, in those cases in which the total number s of non-zero multiplier coefficients of filter 200 is smaller than the sum of the orders of the k+1 stop-filters 200-0 to 200-k, the present invention can still be used to implement the design of certain specific impulse frequency responses.

Another benefit of filter structure 201 is that the impulse frequency response of filter structure 201 as a whole may be made to be any member of a family of impulse frequency responses by making the values of the multiplier coefficients of filter 204 programmable or adaptable, but retaining identical anchor-frequency responses for all members of the family. For example, for a variable excess bandwidth square-root Nyquist filter, anchors in (1) the intersection of family stop bands, (2) intersections of family pass bands, and (3) at the common 3 db down frequency would be transparent to the desired operation, yet reduce the number of programmable coefficients and provide robustness against physical realization error sources.

It should be noted, however, that if both filter 200 and filter 204 are programmable, the number of programmable coefficients are the same as in a conventional filter. In some applications real time selection of pre-calculated efficient designs possessing robustness properties could be utilized. However, usual methods of real time coefficients adaptation are not sensitive to robustness properties, so that the aforesaid benefit of the filter structure 201 configuration may not be realizable.

It should be further noted that, in FIG. 2, filter 204 happens to be ordinally positioned as the last of all the serially-connected filters of the second data path. However, it is apparent that the impulse frequency response of all the serially-connected filters of the second data path, taken as a whole, is not affected by the ordinal position occupied by each individual one of these serially-connected filters. Therefore, the ordinal position of filter 204 could be changed to be the first, or, alternatively, somewhere in between the first and the last, of all the serially-connected filters of the second data path without affecting the impulse frequency response of all the serially-connected filters of the second data path, taken as a whole.

While all the filters comprising the physically-realizable filter structure 201 of FIG. 2 are digital filters, the principles of the present invention are not limited to a physically-realizable filter structures comprising only digital filters. For instance, in some physically-realized systems, either the output and/or input of the filter structure must interface with analog portions of the system. In such cases, it is desirable that the physically-realizable filter structure be a hybrid digital-analog filter structure. In this regard, FIG. 3a shows a first modification of filter structure 201 of FIG. 2 to achieve a digital-in/analog-out hybrid filter structure, and FIG. 3b shows a second modification of filter structure 201 of FIG. 2 to achieve an analog-in/digital-out hybrid filter structure.

Figure 3A:
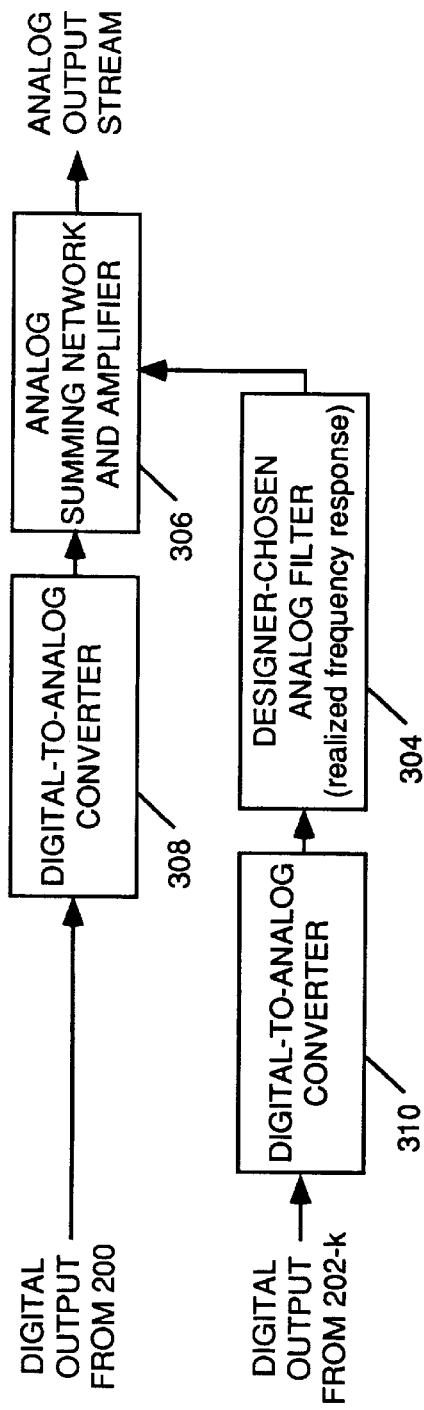
Figure 3B:
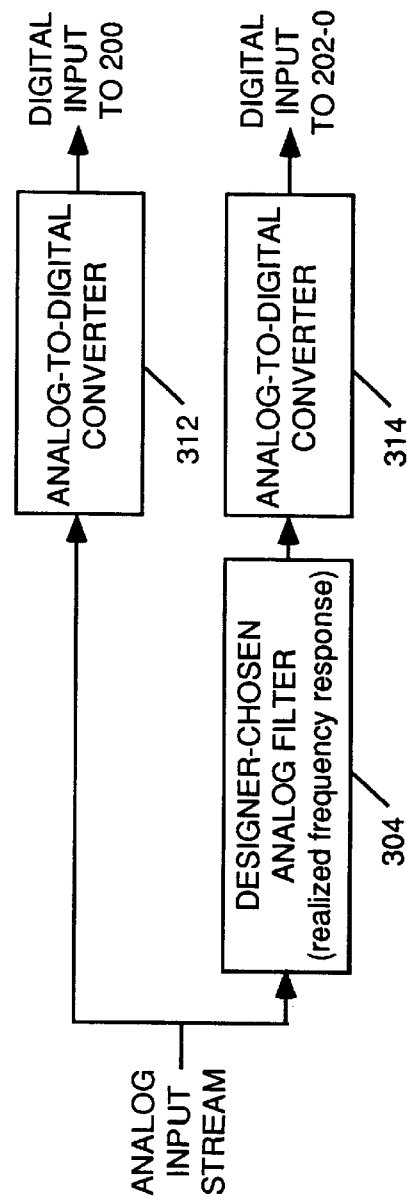

In the first modification of filter structure 201, shown in FIG. 3a, the digital output from filter 200 is applied as an input to digital-to-analog converter 308 and the output from digital-to-analog converter 308 in analog form is applied as a first input to analog summing network and amplifier 306. The digital output from filter 202-k is applied as an input to digital-to-analog converter 310 and the output from digital-to-analog converter 310 in analog form is applied as an input to designer-chosen analog filter 304 (which functionally corresponds to digital filter 204 of FIG. 2). The analog output from filter 304 is applied as a second input to analog summing network and amplifier 306. The analog output stream from analog summing network and amplifier 306 constitutes the output from this first modification of filter structure 201. The digital multiplier coefficients chosen for digital filters 200 and 202-0 to 202-k are matched to the characterization of analog filter 304.

In the second modification of filter structure 201, shown in FIG. 3b, the analog input stream is applied as an input to analog-to-digital converter 312 and the output from analog-to-digital converter 312 is applied as a digital input to filter 200. The analog input stream is also applied as an input to designer-chosen analog filter 304 (which is moved to the first ordinal position of the serially-connected filters of the second data path). The analog output from filter 304 is applied as an input to analog-to-digital converter 314 and the output from analog-to-digital converter 314 is applied as a digital input to filter 202-0. Again, the digital multiplier coefficients chosen for digital filters 200 and 202-0 to 202-k are matched to the characterization of analog filter 304.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made without departing from the central scope thereof. Therefore, it is intended that the present invention not be limited to the particular embodiments disclosed as the best modes contemplated for carrying out the invention, but that the present invention includes all embodiments falling within the scope of the appended claims.

What is claimed is:

1. In a physically-realized filter structure designed to have an impulse frequency response to an ongoing input signal having a given frequency bandwidth applied thereto that is substantially equivalent to a certain theoretical impulse frequency response, wherein said filter structure comprises a given filter that introduces realization errors into its frequency response; the improvement wherein said filter structure further comprises:

means including additional filters for (1) rendering said given filter inoperative at a set comprising at least one selected frequency within said given frequency bandwidth and (2) anchoring the frequency response value of said filter structure in the neighborhood of said one selected frequency of said set substantially at the corresponding theoretical impulse frequency response value in said neighborhood of said one selected frequency of said set.

2. The physically-realized filter structure defined in claim 1, wherein:

said set comprises a plurality of different selected frequencies within said given frequency bandwidth; and said means including additional filters is effective in (1) rendering said given filter inoperative at each of said plurality of different selected frequencies and (2) anchoring the frequency response value of said filter structure in the neighborhood of each one of said plurality of different selected frequencies of said set substantially at the corresponding theoretical impulse frequency response value in said neighborhood of that one of said plurality of different selected frequencies of said set,.

3. The physically-realized filter structure defined in claim 1, wherein said means including additional filters comprises:

a first data path including one of said additional filters that has said input signal applied as an input thereto, said one of said additional filters having an impulse frequency response that substantially matches said theoretical impulse frequency response at said one selected frequency of said set, and the output from said one of said additional filters constituting the output from said first data path;

a second data path including a plurality of serially-connected filters that has said input signal applied as an input thereto, said plurality of serially-connected filters comprising said given filter and another of said additional filters in which said other of said additional filters is a stop-filter that has a transmission response of substantially zero at said one selected frequency of said set, and the output from said plurality of serially-connected filters constituting the output from said second data path; and summing means for summing the output from said first data path applied as a first input to said summing means and the output from said second data path applied as a second input to said summing means;

whereby the summed output from said summing means constitutes the output from said physically-realized filter structure.

4. The physically-realized filter structure defined in claim 3, wherein:

said set comprises a plurality of different selected frequencies within said given frequency bandwidth;

said one of said additional filters has an impulse frequency response that substantially matches said theoretical impulse frequency response at each of said plurality of different selected frequencies of said se; and said plurality of serially-connected filters comprises a plurality of other additional filters, each of which said plurality of other additional filters is a stop-filter that has a transmission response of substantially zero at a separate one of said different selected frequencies of said set.

5. The physically-realized filter structure defined in claim 4, wherein:

each of said additional filters is a digital filter responsive to an ongoing digital signal defining a certain frequency bandwidth applied as an input thereto, wherein said ongoing digital signal comprises successive sample values occurring at a given sampling frequency.

6. The physically-realized filter structure defined in claim 5, wherein:

said certain frequency bandwidth includes zero-frequency (DC); and a certain stop-filter of said plurality of other additional filters is a digital filter having a transmission response of substantially zero at said zero-frequency (DC).

7. The physically-realized filter structure defined in claim 5, wherein:
said certain frequency bandwidth includes a Nyquist folding frequency defined as equal to one-half said given sampling frequency; and
a certain stop-filter of said plurality of other additional filters is a digital filter having a transmission response of substantially zero at said Nyquist folding frequency.

8. The physically-realized filter structure defined in claim 5, wherein:
said certain frequency bandwidth includes both zero-frequency (DC) and a Nyquist folding frequency defined as equal to one-half said given sampling frequency; and
one of two certain stop-filters of said plurality of other additional filters is a digital filter having a transmission response of substantially zero at said zero-frequency (DC) and another of said two certain stop-filters of said plurality of other additional filters is a digital filter having a transmission response of substantially zero at said Nyquist folding frequency.

9. The physically-realized filter structure defined in claim 5, wherein:
said certain frequency bandwidth includes a given frequency that is intermediate zero-frequency (DC) and a Nyquist folding frequency defined as equal to one-half said given sampling frequency; and
a certain stop-filter of said plurality of other additional filters is a digital filter having a transmission response of substantially zero at said given frequency.

10. The physically-realized filter structure defined in claim 5, wherein:
said given filter is a digital filter responsive to an ongoing digital signal defining a certain frequency bandwidth applied as an input thereto, wherein said ongoing digital signal comprises successive sample values occurring at said given sampling frequency.

11. The physically-realized filter structure defined in claim 5, wherein:
said given filter is an analog filter responsive to an ongoing analog signal defining a certain frequency bandwidth applied as an input thereto;
said first data path further includes first converter means for converting between digital and analog signals; and
said second data path further includes second converter means for converting between digital and analog signals.

12. The physically-realized filter structure defined in claim 11, wherein:
said analog filter is ordinally positioned as the last of all said serially-connected filters;
said summing means comprises means including an analog summing network having the analog output from said analog filter applied as said second input thereto;
said first converter means comprises a first digital-to-analog converter for converting the digital output signal from said one of said additional filters of said first data path into an analog input signal that is applied as said first input to said means including said analog summing network; and said second converter means comprises a second digital-to-analog converter for converting the digital output signal from the last ordinally-positioned other additional filter of said plurality of other additional filters of said second data path into an analog input signal that is applied as an input to said analog filter.

13. The physically-realized filter structure defined in claim 12, wherein:
said means including an analog summing network further includes an analog amplifier.

14. The physically-realized filter structure defined in claim 11, wherein:
said input signal applied as an input to each of said first and second data paths is an analog input signal;
said analog filter is ordinally positioned as the first of all said serially-connected filters so that said analog input signal to said second data path is applied as an input to said analog filter;
said first converter means comprises a first analog-to-digital converter for converting the analog input signal to said first data path into a digital input signal applied as an input to said one of said additional filters; and
said second converter means comprises a second analog-to-digital converter for converting the analog output signal from said analog filter into a digital input signal applied as an input to the first ordinally-positioned other additional filter of said plurality of other additional filters of said second data path.

15. In a physically-realized filter structure designed to have an impulse frequency response to an ongoing input signal having a given frequency bandwidth applied thereto that is substantially equivalent to a certain theoretical impulse frequency response, wherein said filter structure comprises a given filter that introduces realization errors into its frequency response; a method for reducing the deleterious effects of these realization errors comprising the step of:
rendering said given filter inoperative at a set comprising at least one selected frequency within said given frequency bandwidth; and
anchoring the frequency response value of said filter structure in the neighborhood of said one selected frequency of said set substantially at the corresponding theoretical impulse frequency response value in said neighborhood of said one selected frequency of said set.

16. The method defined in claim 15, wherein:
said set comprises a plurality of different selected frequencies within said given frequency bandwidth; and
rendering said given filter inoperative at each of said plurality of different selected frequencies; and
anchoring the frequency response value of said filter structure in the neighborhood of each one of said plurality of different selected frequencies of said set substantially at the corresponding theoretical impulse frequency response value in said neighborhood of that one of said plurality of different selected frequencies of said set,.

* * * * *